(12) United States Patent
Lo et al.

(10) Patent No.: US 9,679,818 B2
(45) Date of Patent: Jun. 13, 2017

(54) SEMICONDUCTOR DEVICE STRUCTURE AND METHOD FOR FORMING THE SAME

(71) Applicant: TAIWAN SEMICONDUCTOR MANUFACTURING CO., LTD, Hsin-Chu (TW)

(72) Inventors: An-Lun Lo, New Taipei (TW); Wei-Shuo Ho, New Taipei (TW); Tzong-Sheng Chang, Chubei (TW); Chrong-Jung Lin, Hsin-Chu (TW); Ya-Chin King, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/530,060

(22) Filed: Oct. 31, 2014

(65) Prior Publication Data
US 2016/0126309 A1    May 5, 2016

(51) Int. Cl.
*H01L 29/66* (2006.01)
*H01L 21/8234* (2006.01)
(Continued)

(52) U.S. Cl.
CPC .... *H01L 21/823481* (2013.01); *H01L 27/088* (2013.01); *H01L 27/11206* (2013.01);
(Continued)

(58) Field of Classification Search
CPC . H01L 21/28123; H01L 21/76; H01L 21/762; H01L 21/76202; H01L 21/76213;
(Continued)

(56) References Cited

U.S. PATENT DOCUMENTS

2008/0246083 A1\* 10/2008 Tien ..................... H01L 29/0653
  257/336
2010/0221874 A1   9/2010 Kuo et al.
(Continued)

FOREIGN PATENT DOCUMENTS

KR   10-2012-0099539 A   9/2012
KR   10-2014-0055907 A   5/2014

*Primary Examiner* — Earl Taylor
*Assistant Examiner* — Samuel Park
(74) *Attorney, Agent, or Firm* — Birch, Stewart, Kolasch & Birch, LLP

(57) ABSTRACT

A semiconductor device structure is provided. The semiconductor device structure includes a semiconductor substrate. The semiconductor device structure includes a first gate stack positioned over the semiconductor substrate. The semiconductor device structure includes a first doped structure and a second doped structure positioned at two opposite sides of the first gate stack and embedded in the semiconductor substrate. The semiconductor device structure includes a second gate stack positioned over the semiconductor substrate and adjacent to the second doped structure. The semiconductor device structure includes a third gate stack positioned over the semiconductor substrate. The semiconductor device structure includes an isolation structure embedded in the semiconductor substrate and between the second gate stack and the third gate stack. The isolation structure is wider and thinner than the second doped structure, and the isolation structure is made of an epitaxial material.

20 Claims, 22 Drawing Sheets

(51) Int. Cl.
  *H01L 27/088* (2006.01)
  *H01L 27/112* (2006.01)
  *H01L 29/78* (2006.01)
  *H01L 29/165* (2006.01)

(52) U.S. Cl.
  CPC .. *H01L 29/66545* (2013.01); *H01L 29/66636* (2013.01); *H01L 29/165* (2013.01); *H01L 29/7848* (2013.01)

(58) Field of Classification Search
  CPC ......... H01L 21/76218; H01L 21/76224; H01L 21/76237; H01L 21/76245; H01L 21/76264; H01L 21/76267–21/763; H01L 21/823481; H01L 21/823493; H01L 21/823878; H01L 21/823892
  USPC ........................................................ 257/401
  See application file for complete search history.

(56)  References Cited

U.S. PATENT DOCUMENTS

2011/0242904 A1    10/2011  Wu et al.
  2012/0181607 A1*   7/2012  Ryu .................. H01L 21/28273
                                                           257/337
  2014/0117456 A1    5/2014  Huang et al.

\* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description, when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
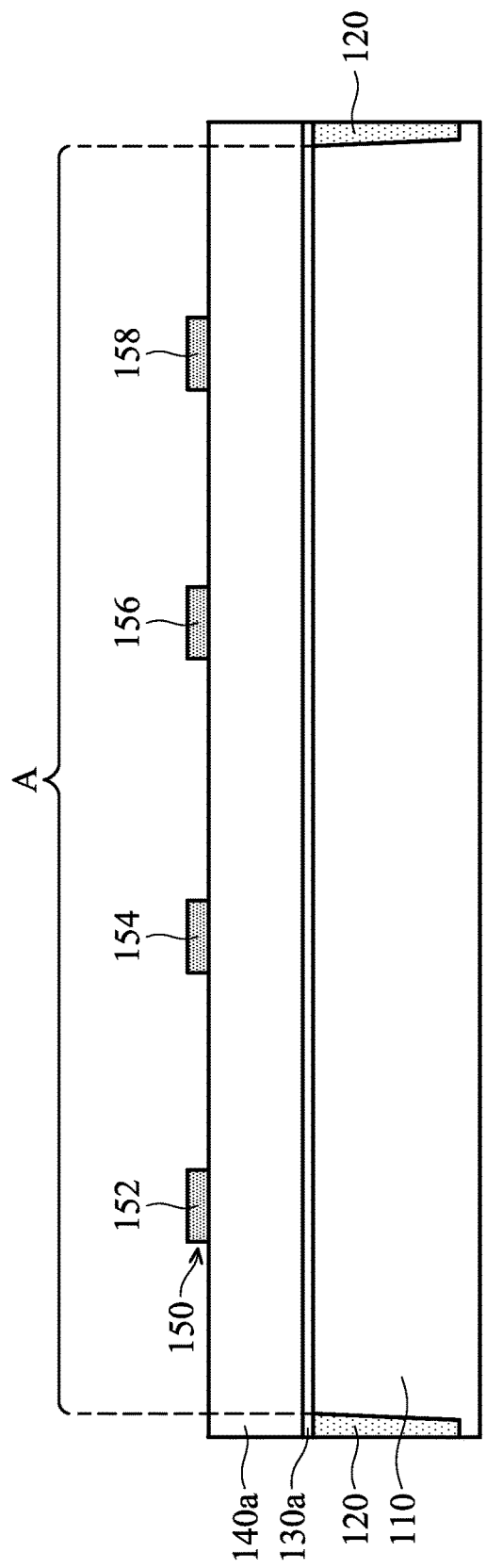
FIGS. 1A-1P are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may he used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
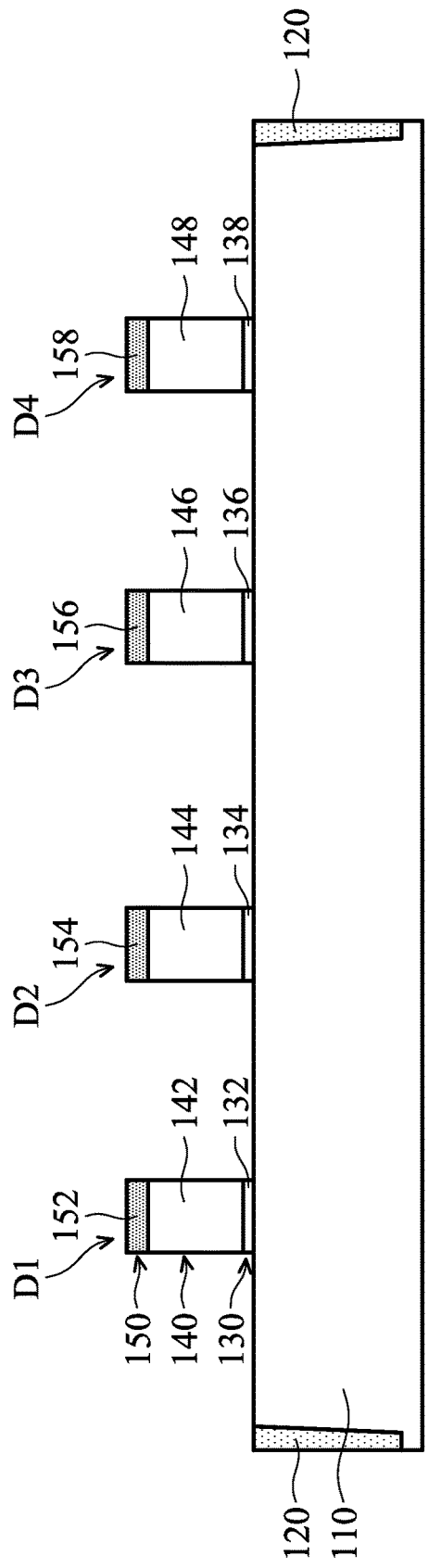
Figure 1C:
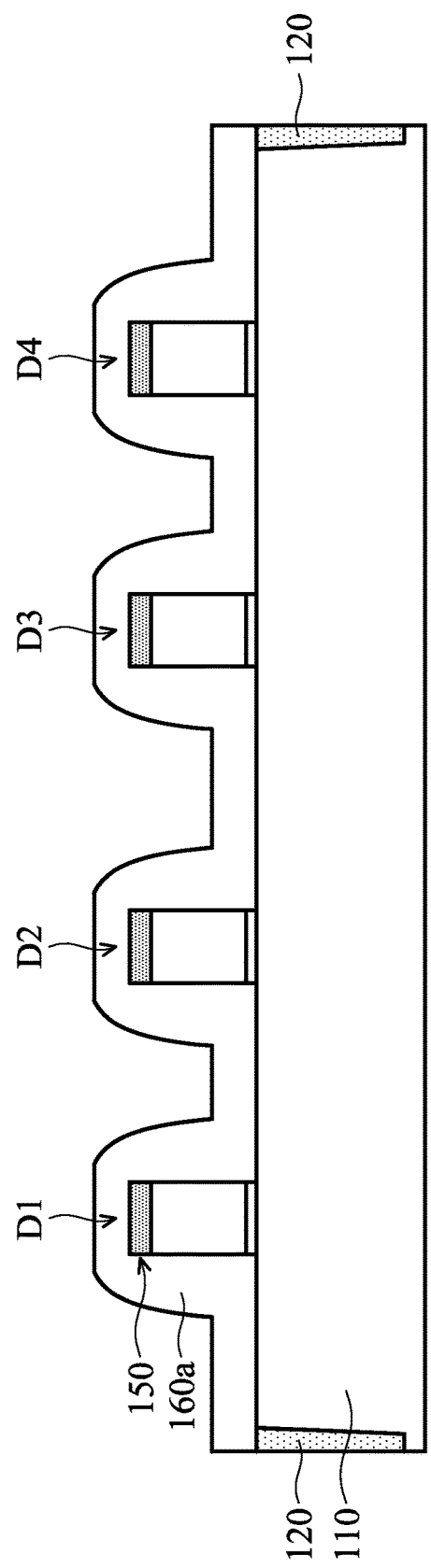
Figure 1D:
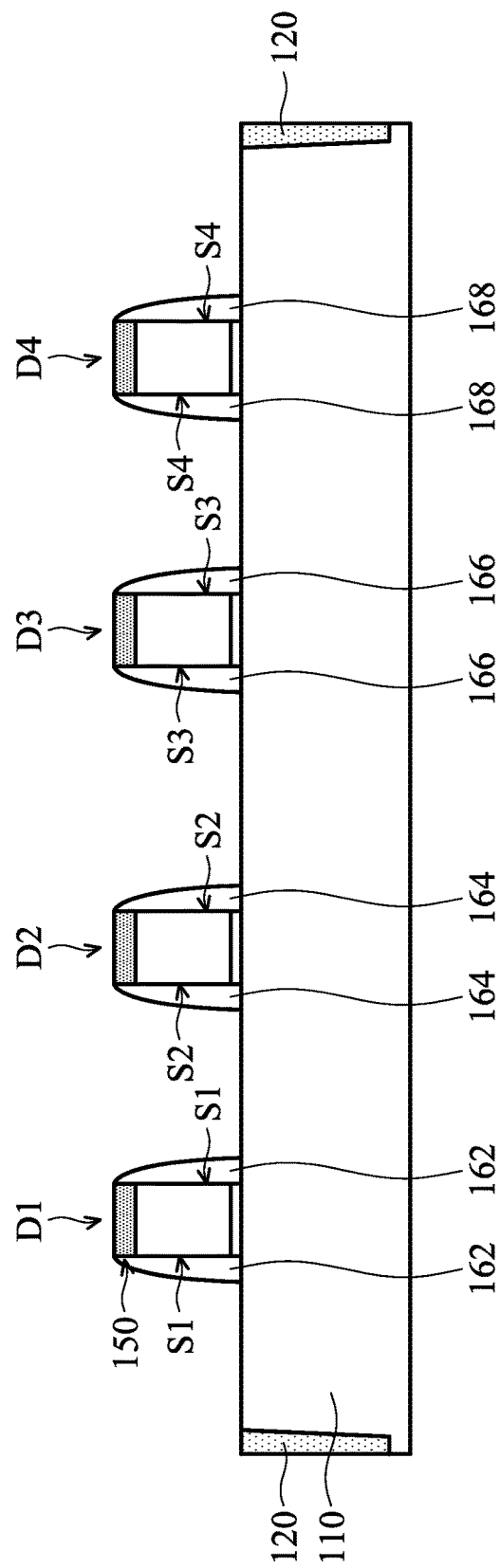
Figure 1E:
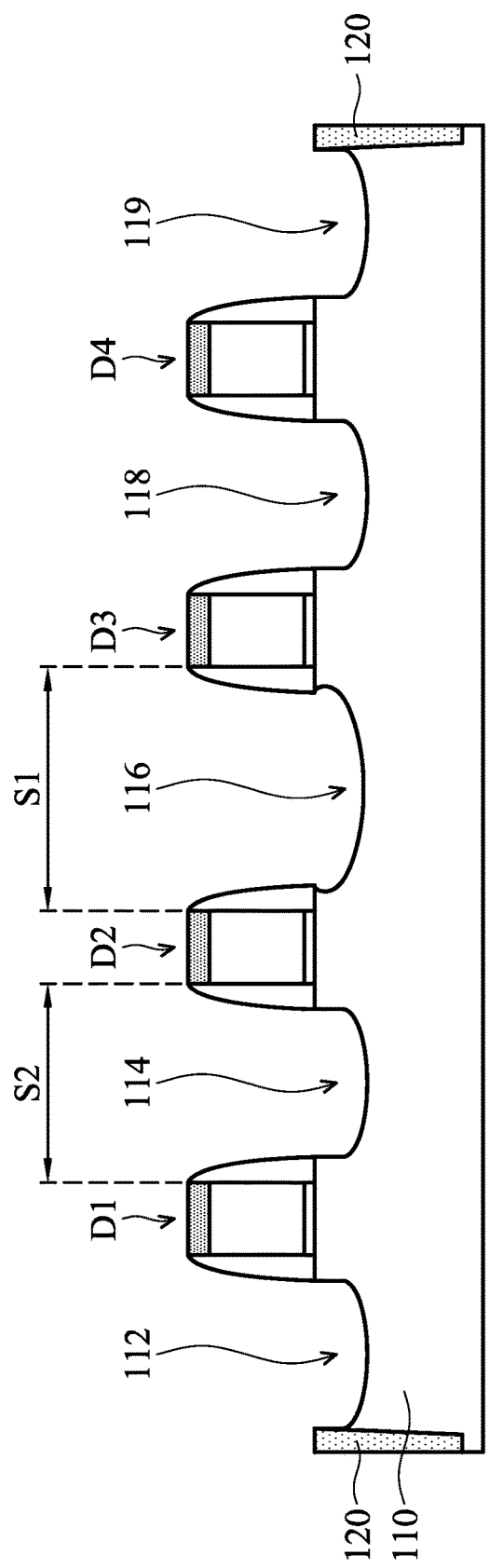
Figure 1F:
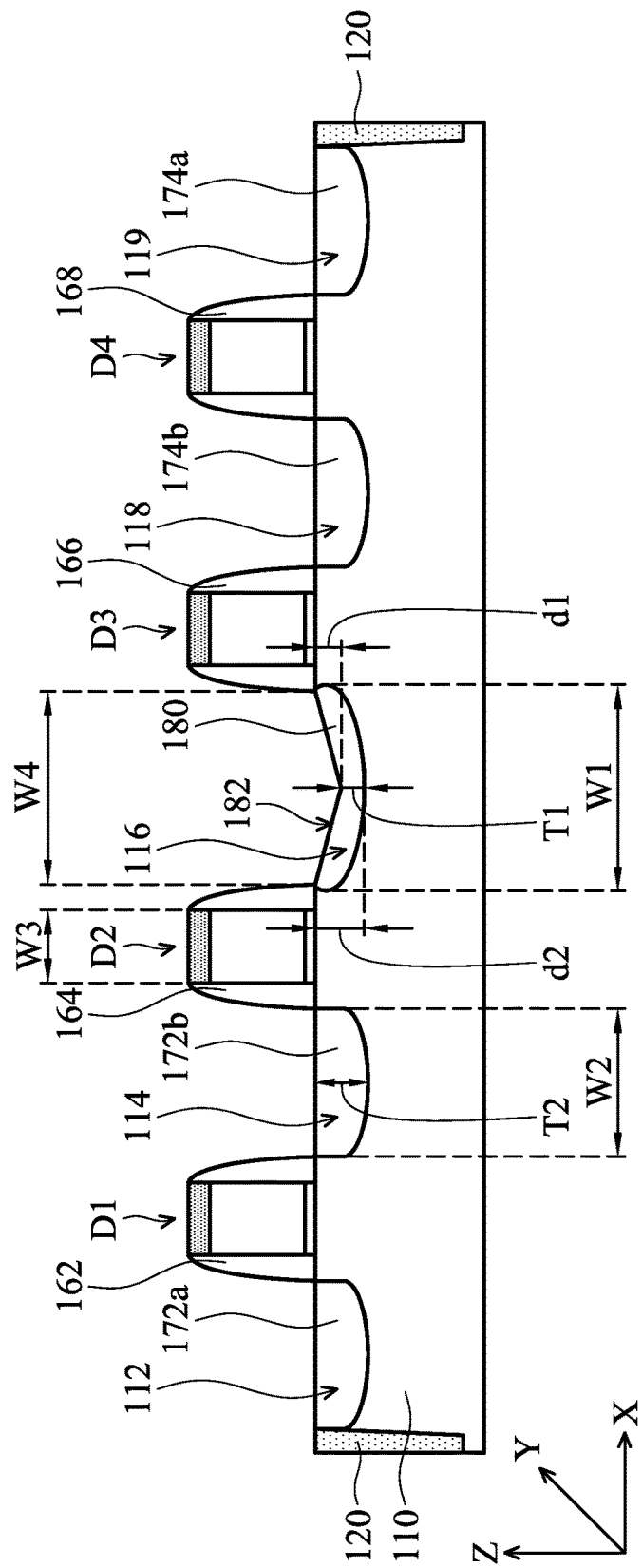
Figure 1G:
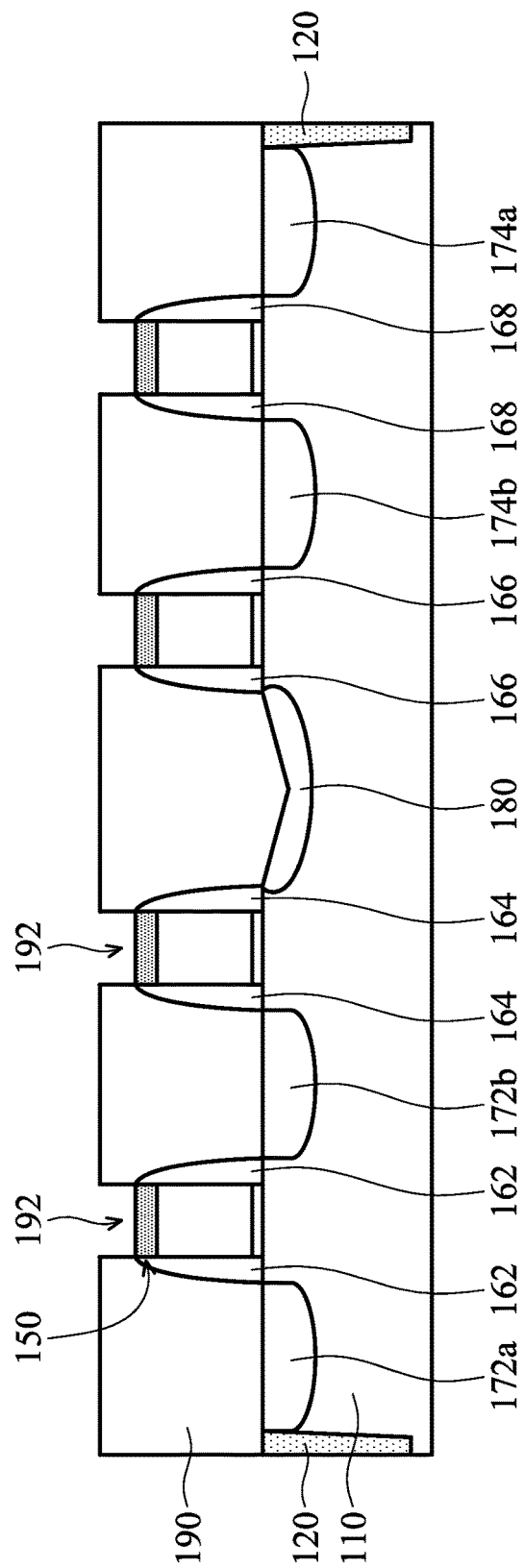
Figure 1H:
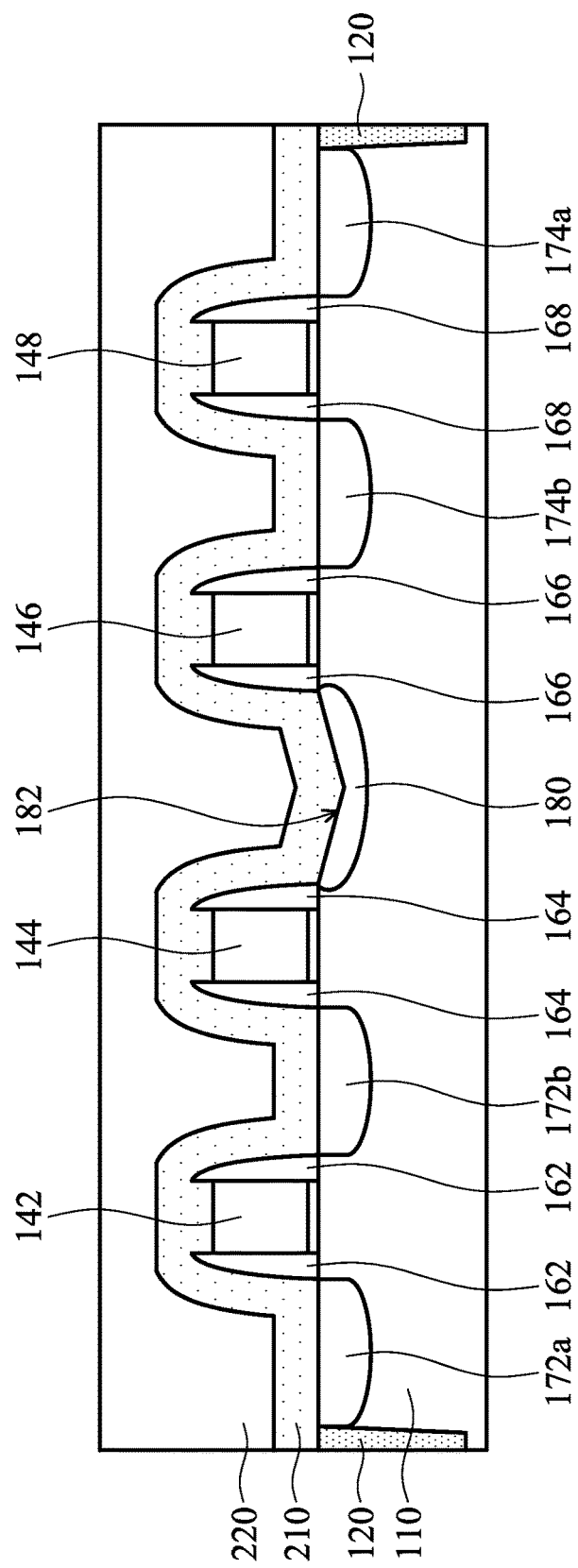
Figure 1I:
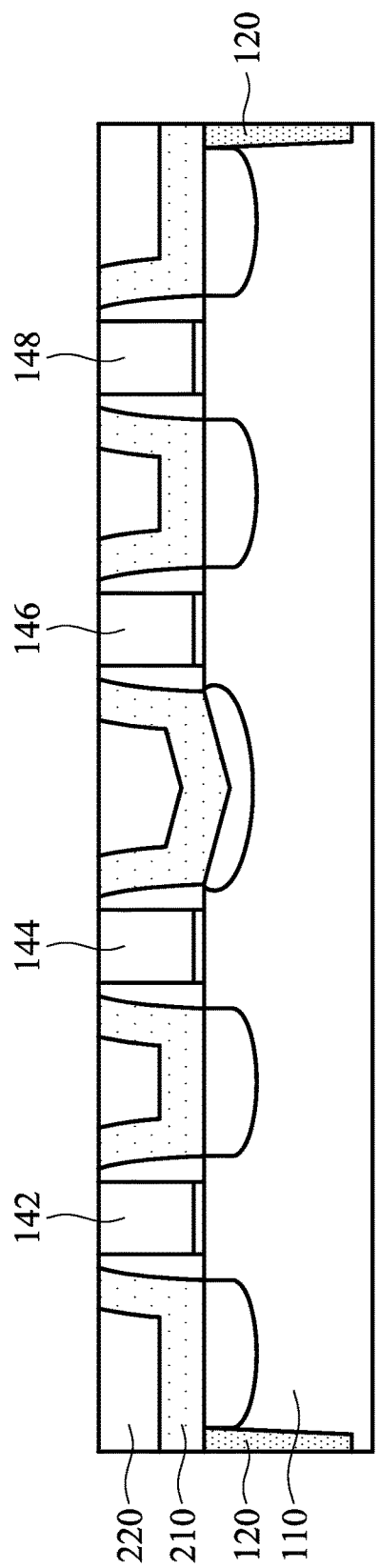
Figure 1J:
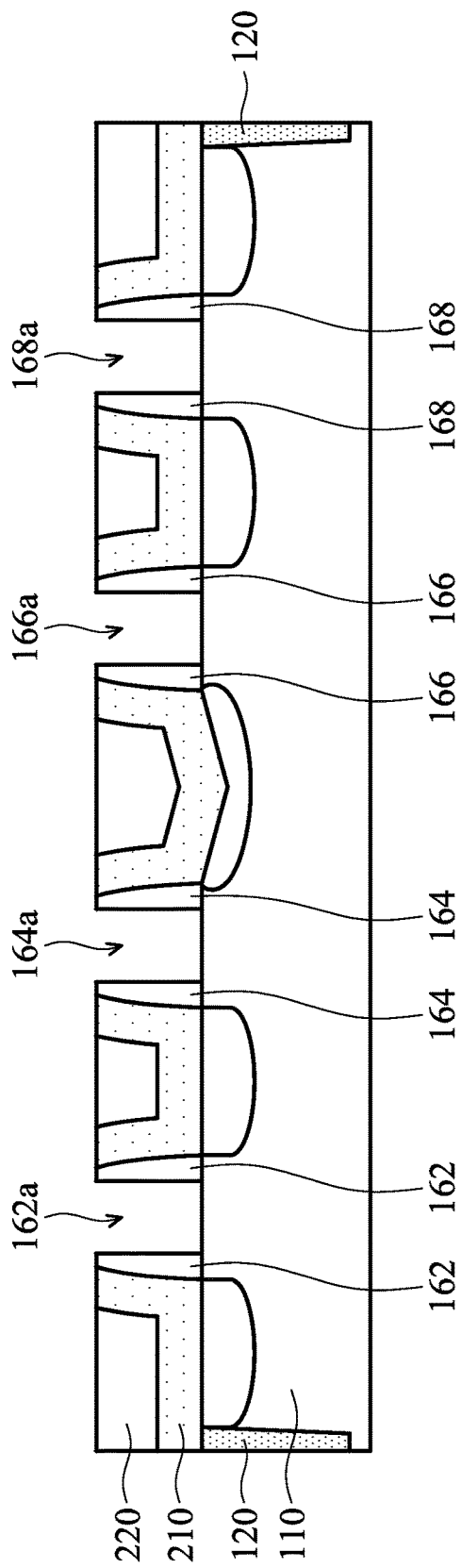
Figure 1K:
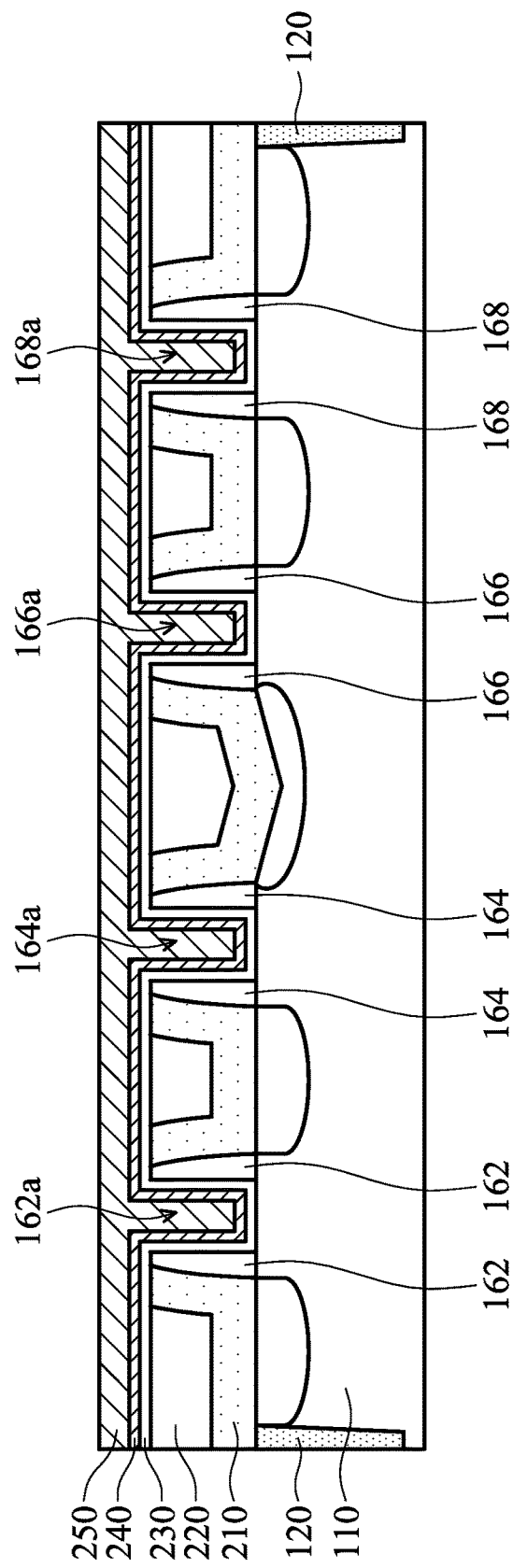
Figure 1L:
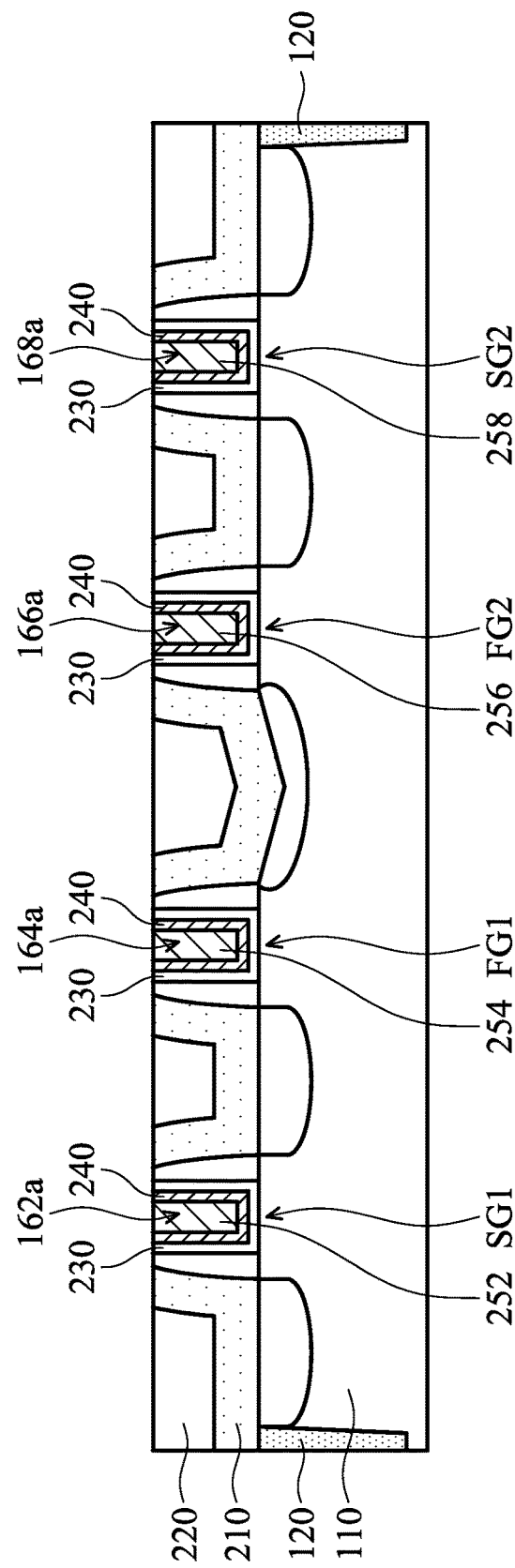
Figure 1M:
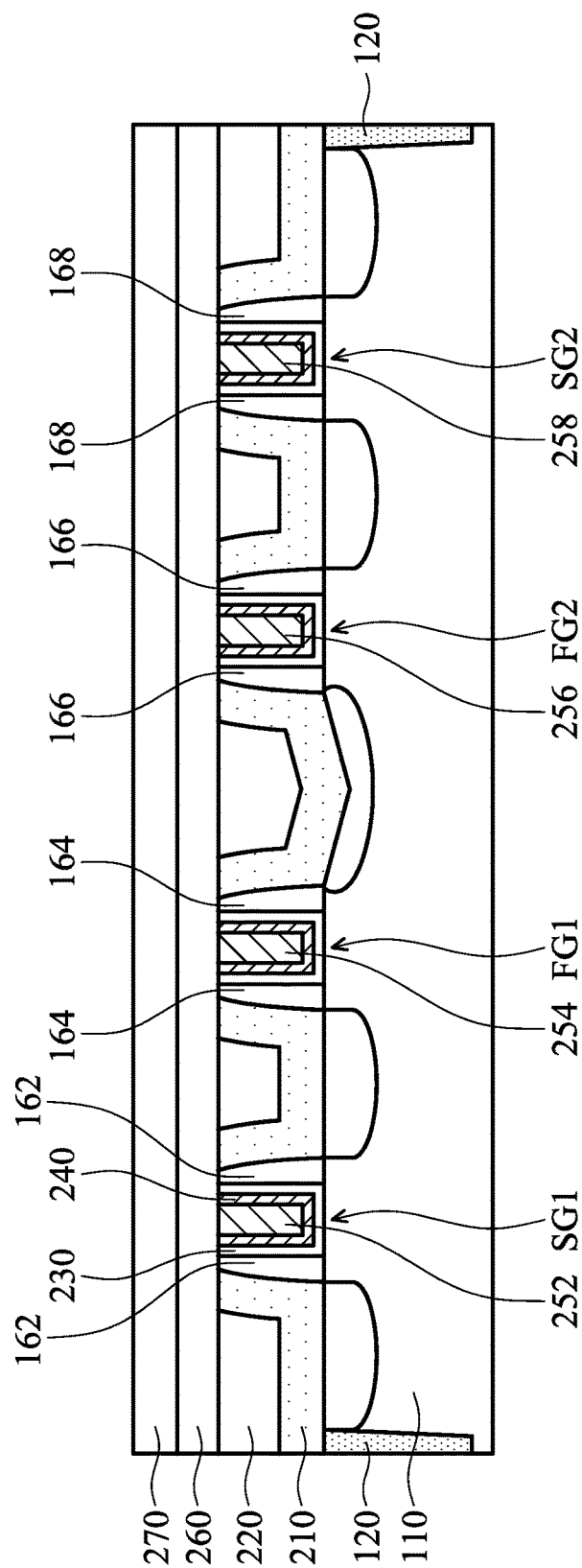
Figure 1N:
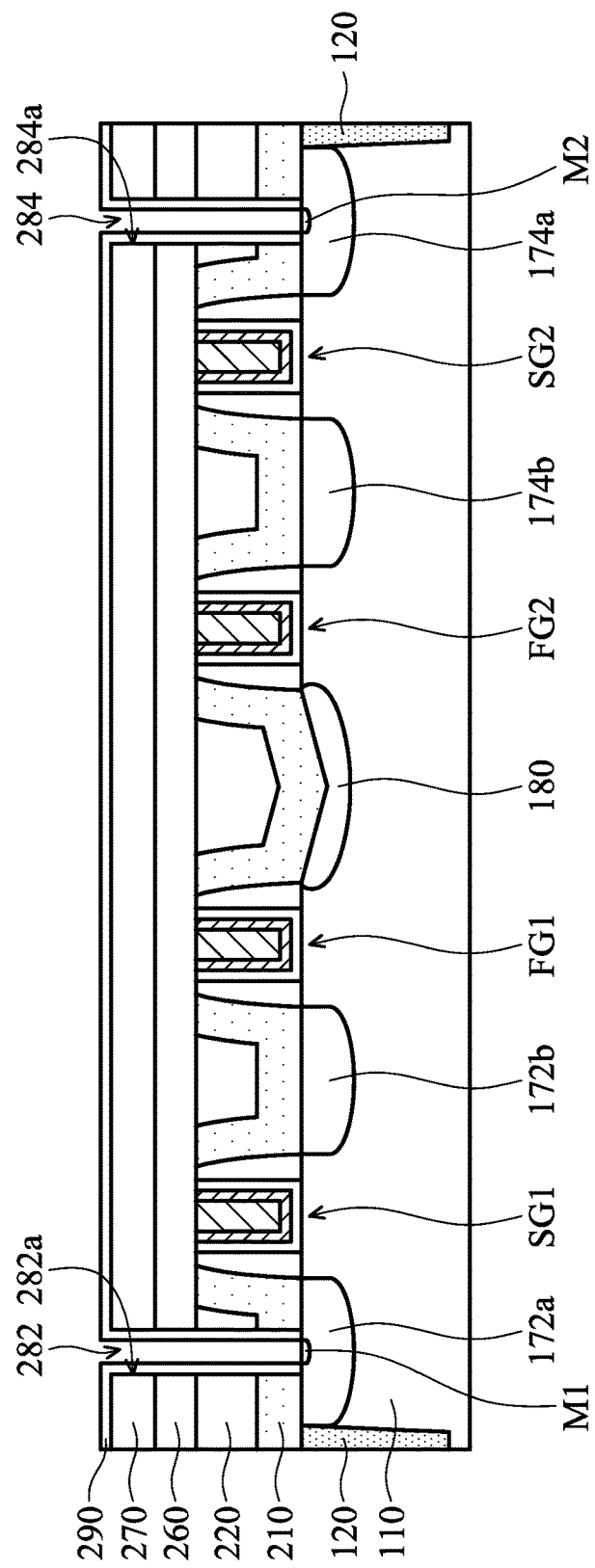
Figure 1O:
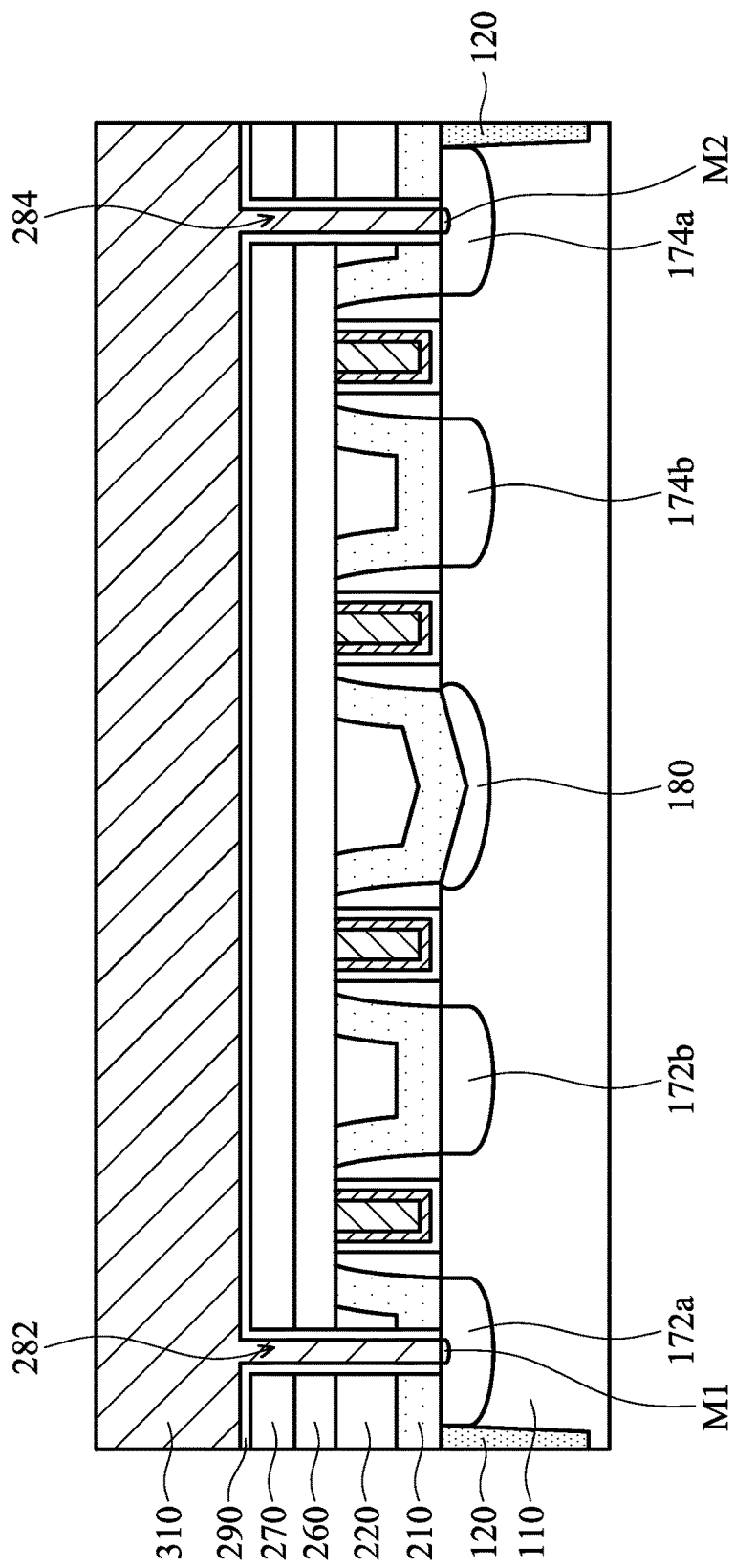
Figure 1P:
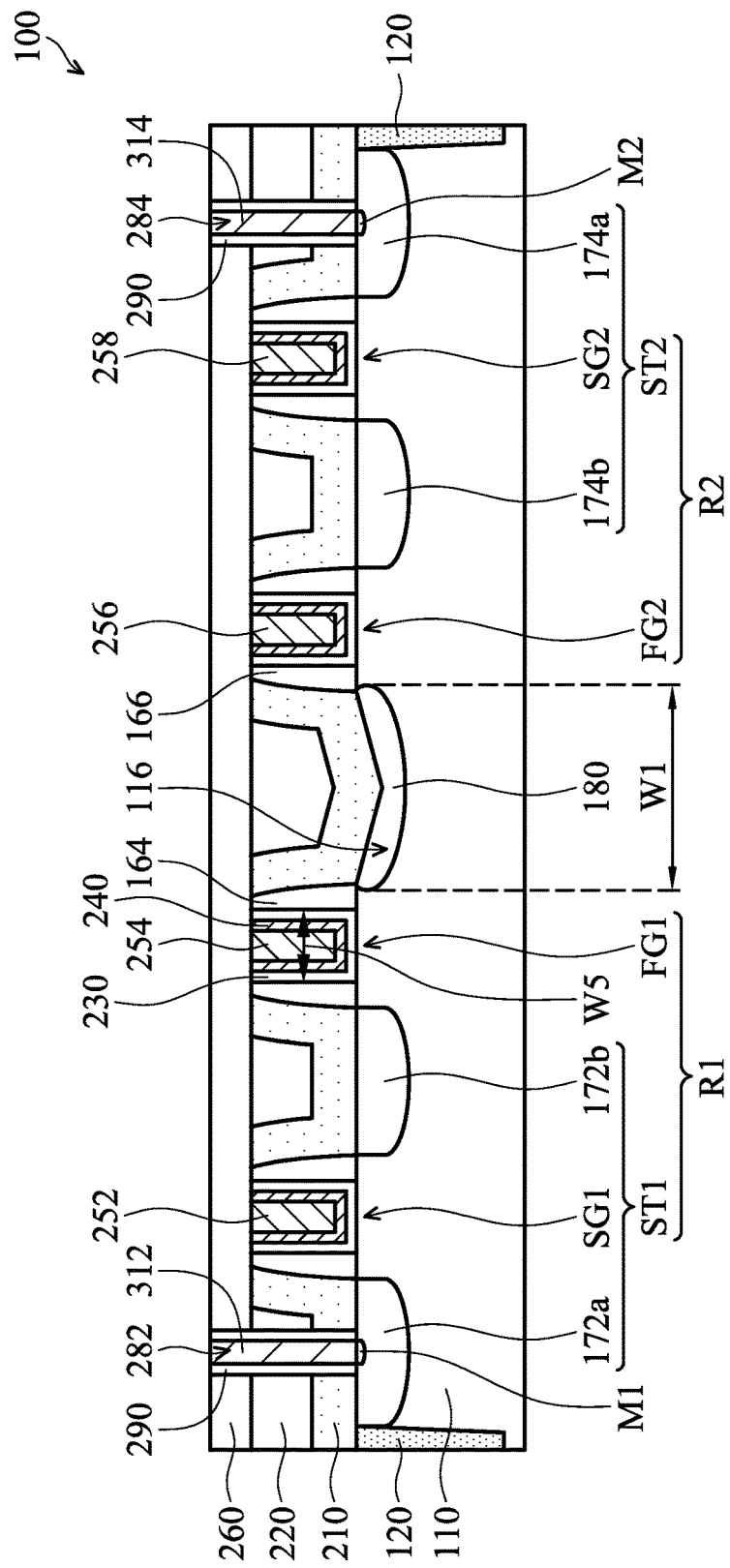

FIGS. 1A-1P are cross-sectional views of various stages of a process for forming a semiconductor device structure 100, in accordance with some embodiments. As shown in FIG. 1A, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIG. 1A, a shallow trench isolation (STI) structure 120 is formed in the semiconductor substrate 110, in accordance with some embodiments. The STI structure 120 is configured to define and electrically isolate various device elements (not shown) formed in active regions A of the semiconductor substrate 110, in accordance with some embodiments. For the sake of simplicity, FIG. 1A only shows one of the active regions A of the semiconductor substrate 110, in accordance with some embodiments.

Examples of the various device elements include transistors (e.g., metal, oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The STI structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The STI structure 120 is formed by using an isolation technology, such as local oxidation of semiconductor (LOCOS), shallow trench isolation (STI), or the like, in accordance with some embodiments.

In some embodiments, the formation of the STI structure 120 includes patterning the semiconductor substrate 110 by performing a photolithography process and an etching process on the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIG. 1A, a gate dielectric material layer 130a is deposited over the semiconductor substrate 110, in accordance with some embodiments. The gate dielectric material layer 130a is made of silicon oxide, in accordance with some embodiments. The gate dielectric material layer 130a is deposited using a chemical vapor deposition process (CVD process), in accordance with some embodiments.

As shown in FIG. 1A, a gate material layer 140a is deposited over the gate dielectric material layer 130a, in accordance with some embodiments. In some embodiments, the gate material layer 140a is also referred to as a dummy gate material layer. The gate material layer 140a is made of polysilicon, in accordance with some embodiments. The gate material layer 140a is deposited using a chemical vapor deposition process, in accordance with some embodiments.

As shown in FIG. 1A, a mask layer 150 is formed over the gate material layer 140a, in accordance with some embodiments. The mask layer 150 is located in the active region A, in accordance with some embodiments. The mask layer 150 exposes a portion of the gate material layer 140a, in accordance with some embodiments.

The mask layer 150 includes a first portion 152, a second portion 154, a third portion 156, and a fourth portion 158, in accordance with some embodiments. The first portion 152, the second portion 154, the third portion 156, and the fourth portion 158 are separated from each other, in accordance with some embodiments.

In some embodiments, the mask layer 150 includes oxide or nitride, such as silicon oxide, silicon oxynitride, silicon nitride, or the like. The mask layer 150 is formed by a depositing process (such as a chemical vapor deposition process), a photolithography process, and an etching process, in accordance with some embodiments.

As shown in FIG. 1B, the gate material layer 140a exposed by the mask layer 150 is removed, and the gate dielectric material layer 130a under the removed gate material layer 140a is also removed, in accordance with some embodiments. The removal process includes a dry etching process, in accordance with some embodiments.

The gate material layer 140a remaining under the mask layer 150 forms a gate layer 140, in accordance with some embodiments. The gate layer 140 includes gates 142, 144, 146, and 148, in accordance with some embodiments. The gates 142, 144, 146, and 148 are separated from each other, in accordance with some embodiments.

The gate 142 is located under the first portion 152 of the mask layer 150, in accordance with some embodiments. The gate 144 is located under the second portion 154, in accordance with some embodiments. The gate 146 is located under the third portion 156, in accordance with some embodiments. The gate 148 is located under the fourth portion 158, in accordance with some embodiments.

The gate dielectric material layer 130a remaining under the gate layer 140 forms a gate dielectric layer 130, in accordance with some embodiments. The gate dielectric layer 130 includes a first gate dielectric structure 132, a second gate dielectric structure 134, a third gate dielectric structure 136, and a fourth gate dielectric structure 138, in accordance with some embodiments. The first gate dielectric structure 132, the second gate dielectric structure 134, the third gate dielectric structure 136, and the fourth gate dielectric structure 138 are separated from each other, in accordance with some embodiments.

The first portion 152 of the mask layer 150, the gate 142, and the first gate dielectric structure 132 together form a gate stack D1, in accordance with some embodiments. The second portion 154, the gate 144, and the second gate dielectric structure 134 together form a gate stack D2, in accordance with some embodiments.

The third portion 156, the gate 146, and the third gate dielectric structure 136 together form a gate stack D3, in accordance with some embodiments. The fourth portion 158, the gate 148, and the fourth gate dielectric structure 138 together form a gate stack D4, in accordance with some embodiments. In some other embodiments, the gate stacks D1, D2, D3, and D4 do not include the mask layer 150.

Thereafter, a protective layer (not shown) may be formed over the semiconductor substrate 110 to cover the mask layer 130, the gate layer 140, and the gate dielectric layer 130. The protective layer is configured to protect spacers formed subsequently from damage during a dummy-gate removal process, in accordance with some embodiments. The protective layer includes oxide, in accordance with some embodiments.

The protective layer is formed by an atomic layer deposition (ALD) process, a chemical vapor deposition, process, or a physical vapor deposition (PVD) process, in accordance with some embodiments. The protective layer conformally covers the mask layer 150, the gate layer 140, and the gate dielectric layer 130, in accordance with some embodiments.

As shown in FIG. 1C, a spacer layer 160a is formed over the semiconductor substrate 110 to cover the gate stacks D1, D2, D3, and D4, in accordance with some embodiments. The spacer layer 160a includes an insulating material, such as silicon oxide or silicon nitride. The spacer layer 160a is formed using a chemical vapor deposition process, in accordance with some embodiments.

As shown in FIGS. 1C and 1D, an anisotropic etching process is performed to remove a portion of the spacer layer 160a, in accordance with some embodiments. The spacer layer 160a remaining over sidewalls S1 of the gate stack D1 forms spacers 162, in accordance with some embodiments. The spacer layer 160a remaining over sidewalls S2 of the gate stack D2 forms spacers 164, in accordance with some embodiments.

The spacer layer 160a remaining over sidewalls S3 of the gate stack D3 forms spacers 166, in accordance with some embodiments. The spacer layer 160a remaining over sidewalls S4 of the gate stack D4 forms spacers 168, in accordance with some embodiments. In some other embodiments, the spacers 162, 164, 166, and 168 are not formed. The anisotropic etching process includes a dry etching process, in accordance with some embodiments.

As shown in FIG. 1E, portions of the semiconductor substrate 110 are removed to form recesses 112, 114, 116, 118, and 119 in the semiconductor substrate 110, in accordance with some embodiments. The recess 112 is adjacent to the gate stack D1, in accordance with some embodiments. The recess 112 is located between the gate stack D1 and the STI structure 120, in accordance with some embodiments.

The recess 114 is located between the gate stack D1 and the gate stack D2, in accordance with some embodiments. The recess 136 is located between the gate stack D2 and the gate stack D3, in accordance with some embodiments. The recess 118 is located between the gate stack D3 and the gate stack D4, in accordance with some embodiments. The recess 119 is adjacent to the gate stack D4, in accordance with some embodiments. The recess 119 is located between the gate stack D4 and the STI structure 120, in accordance with some embodiments.

In some embodiments, a spacing S1 between the gate stacks D2 and D3 is greater than a spacing S2 between the gate stacks D1 and D2. Therefore, the recess 116 is wider than the recess 114, in accordance with some embodiments. In some embodiments, the recess 116 is also wider than the recess 112, 118, or 119. In some embodiments, the recesses 112, 114, 116, 118, and 119 have substantially the same depth.

The removal of the portions of the semiconductor substrate 110 includes performing an etching process using the gate stacks D1, D2, D3, and D4 and the spacers 162, 164, 166, and 168 as an etching mask, in accordance with some embodiments. Therefore, the recesses 112, 114, 116, 118, and 119 are substantially self-aligned with the gate stacks D1, D2, D3, and D4, respectively. The etching process includes, for example, a dry etching process.

As shown in FIG. 1F, an epitaxial process is performed to form doped structures 172a, 172b, 174a, and 174b, and an isolation structure 180 in the recesses 112, 114, 119, 118, and 116, respectively, in accordance with some embodiments. In some embodiments, the doped structures 172a and 172b serve as a source structure and a drain structure. In some embodiments, the doped structures 174a and 174b serve as a source structure and a drain structure. In some embodiments, the doped structures 172a, 172b, 174a, and 174b also serve as stressors.

The doped structures 172a, 172b, 174a, and 174b include SiGe, SiC, or another suitable material. The doped structures 172a, 172b, 174a, and 174b are doped with n-type impurities (e.g., phosphorus) or p-type impurities (e.g., boron), m accordance with some embodiments.

The isolation structure 180 and the doped structures 172a, 172b, 174a, and 174b may be made of the same material. The isolation structure 180 is made of an epitaxial material, in accordance with some embodiments. The epitaxial process includes a selective epitaxial growth (SEG) process.

The isolation structure. 180 is wider and thinner than, the doped structure 172a, 172b, 174a, or 174b. The isolation structure 180 has a width W1 and a thickness T1, in accordance with some embodiments. Therefore, the resistance of the isolation structure 180 in an X-axis direction is greater than that of the eloped structure 172a, 172b, 174a, or 174b. The X-axis direction is parallel to the width direction of the isolation structure 180 and the doped structures 172a, 172b, 174a, and 174b, in accordance with some embodiments.

The doped structure 172b has a width W2 and a thickness T2, in accordance with some embodiments. A ratio (W1/W2) of the width W1 to the width W2 ranges from, about 1.2 to about 10, in accordance with some embodiments. The ratio (W1/W2) of the width W1 to the width W2 ranges from about 1.2 to about 3, in accordance with some embodiments. The width W1 ranges from about 50 nm to about 500 nm, in accordance with some embodiments.

The width W1 should be maintained in a proper range, for example the above-described value, but is not limited thereto. If the width W1 is too large, the isolation structure 180 may occupy too much area of the semiconductor substrate 110. If the width W1 is too small, the resistance of the isolation structure 180 may be too small.

The gate stack D1, D2, D3, or D4 has a width W3, in accordance with some embodiments. A ratio (W1/W3) of the width WS to the width W3 ranges from about 2 to about 25, in accordance with some embodiments. The width W3 ranges from about 20 nm to about 50 nm, in accordance with some embodiments. A ratio (T1/T2) of the thickness T1 to the thickness T2 ranges from about 0.3 to about 0.7, in accordance with some embodiments. The thickness T1 ranges from about 15 nm to about 35 nm, in accordance with some embodiments.

Since the recess 116 is wider than the recess 112, 114, 118, and 119, the isolation structure 180 does not fill the recess 116. Therefore, the isolation structure 180 has a recess 182, in accordance with some embodiments. The recess 182 is in, for example, a V shape. The recess 182 has a width W4 and a depth d1, in accordance with some embodiments.

A ratio (W4/d1) of the width W4 to the depth d1 ranges from a boat 1 to about 100, in accordance with some embodiments. The depth d1 ranges from about 5 nm to about 50 nm, in accordance with some embodiments. A ratio of the depth d1 of the recess 182 to a depth d2 of the recess 116 ranges from about 0.1 to about 0.95, in accordance with some embodiments.

As shown in FIG. 1G, a mask layer 190 is formed over the semiconductor substrate 110, the spacers 162, 164, 166, and 168, the isolation structure 180, the doped structures 172a, 172b, 174a, and 174b, in accordance with some embodiments. The mask layer 190 is a photoresist layer, in accordance with some embodiments. The mask layer 190 has openings 192 exposing the mask layer 150, in accordance with some embodiments.

As shown in FIGS. 1G and 1H, the mask layer 150 is removed through the openings 192, in accordance with some embodiments. The removal process includes a dry etching process, in accordance with some embodiments. Thereafter, the mask layer 190 is removed.

As shown in FIG. 1H, a contact etching stop layer 210 is formed over the semiconductor substrate 110 to cover the doped structures 172a, 172b, 174a, and 174b, in accordance with some embodiments. The contact etching stop layer 210 fills the recess 182, in accordance with some embodiments. The contact etching stop layer 210 includes a dielectric material, in accordance with some embodiments. The contact etching stop layer 210 includes silicon nitride, in accordance with some embodiments.

The contact etching stop layer 210 is formed over the doped structures 172a, 172b, 174a, and 174b, the isolation structure 180, the spacers 162, 164, 166, and 168, the gates 142, 144, 146, and 148, and the semiconductor substrate 110, in accordance with some embodiments. In some other embodiments, the contact etching stop layer 210 is not formed.

As shown in FIG. 1H, an insulating layer 220 is deposited over the contact etching stop layer 210, in accordance with some embodiments. The insulating layer 220 includes silicon oxide, silicon oxynitride, borosilicate glass (BSG), phosphoric silicate glass (PSG), borophosphosilicate glass (BPSO), fluorinated silicate glass (FSG), low-k material, porous dielectric material, or combinations thereof, in accordance with some embodiments. The insulating layer 220 is deposited using a CVD process, a HDPCVD process, a spin-on process, a sputtering process, or a combination thereof, in accordance with some embodiments.

Afterwards, as shown is FIG. 1I, a planarization process is performed on the insulating layer 220 until top surfaces of the gates 142, 144, 146, and 148 are exposed, in accordance with some embodiments. The planarization process includes a chemical mechanical polishing (CMP) process, in accordance with some embodiments. After the planarization process is performed, the insulating layer 220 has a substantially planar surface to facilitate subsequent steps in the process.

As shown in FIG. 1J, the gates 142, 144, 146, and 148 are removed, in accordance with some embodiments. The removal process for removing the gates 142, 144, 146, and 148 includes a wet etching process, a dry etching process, or a combination thereof, in accordance with some embodiments. In some embodiments, the gate dielectric layer 130 is also removed.

After the gates 142, 144, 146, and 148 and the gate dielectric layer 130 are removed, openings 162a, 164a, 166a, and 168a are formed between the spacers 162, 164, 166, and 168, respectively. The openings 162a, 164a, 166a, and 168a are trenches, in accordance with some embodiments.

As shown in FIG. 1K, a gate dielectric layer 230 is formed to cover bottoms of the openings 162a, 164a, 166a, and 168a, in accordance with some embodiments. The gate dielectric layer 230 further covers the inner walls of the openings 162a, 164a, 166a, and 168a, top surfaces of the spacers 162, 164, 166, and 168, the contact etching stop layer 210, and the insulating layer 220, in accordance with some embodiments.

The gate dielectric layer 230 includes a dielectric material, such as a high dielectric constant (high-k) material. The high-k material is made of metal oxides, metal nitrides, metal silicates, transition metal-oxides, transition metal-nitrides, transition metal-silicates, oxynitrides of metals, or combinations thereof, in accordance with some embodiments.

The high-k material includes aluminum oxide, hafnium dioxide-alumina ($HfO_2$—$Al_2O_3$) alloy, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof.

The gate dielectric layer 230 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 230 needs to be further annealed.

An intermediate dielectric layer (not shown) may be formed over the semiconductor substrate 110 before the gate dielectric layer 230 is formed. The intermediate dielectric layer includes a suitable dielectric material, such as silicon oxide, hafnium silicate, silicon oxynitride, or combinations thereof.

As shown in FIG. 1K, a work function metal layer 240 is deposited over the gate dielectric layer 230, in accordance with some embodiments. The work function metal layer 240 provides a desired work function for transistors to enhance device performance, including having an improved threshold voltage.

In the embodiments of forming an NMOS transistor, the work function metal layer 240 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a PMOS transistor, the work function metal layer 240 can be a p-type metal capable of providing a work function value suitable for the device, such as equal to or greater than about 4.8 eV. The p-type metal includes metal, metal carbide, metal nitride, other suitable materials, or combinations thereof, in accordance with some embodiments. For example, the p-type metal is made of titanium, titanium nitride, other suitable materials, or combinations thereof.

The work function metal layer 240 is made of hafnium, zirconium, titanium, tantalum, aluminum, metal carbide (e.g., hafnium carbide, or zirconium carbide), aluminide, ruthenium or combinations thereof, in accordance with some embodiments. The work function metal layer 240 is deposited using a PVD process, CVD process, ALD process, plating process, another suitable method, or combinations thereof, in accordance with some embodiments.

As shown in FIG. 1K, a gate electrode layer 250 (also called a metal gate electrode layer) is deposited over the work function metal layer 240 to fill the openings 162a, 164a, 166a, and 168a, in accordance with some embodiments. The gate electrode layer 250 includes a suitable metal material, such as aluminum, tungsten, gold, platinum, cobalt, another suitable metal, an alloy thereof, or combinations thereof, in accordance with some embodiments. The gate electrode layer 250 is deposited using a PVD process, a CVD process, a plating, process, the like, or combinations thereof, in accordance with some embodiments.

Afterwards, as shown in FIG. 1L, a planarization process is performed to remove the gate electrode layer 250, the work fit action metal layer 240, and the gate dielectric layer 230 outside of the openings 162a, 164a, 166a, and 168a, in accordance with some embodiments. The planarization process includes a chemical mechanical polishing (CMP) process or the like, in accordance with some embodiments.

The gate electrode layer 250 remaining in the opening 162a forms a gate electrode 252, in accordance with some embodiments. The gate electrode layer 250 remaining in the opening 164a forms a gate electrode 254, in accordance with some embodiments. The gate electrode layer 250 remaining in the opening 166a forms a gate electrode 256, in accordance with some embodiments. The gate electrode layer 250 remaining in the opening 168a forms a gate electrode 258, in accordance with some embodiments.

The gate electrode 252, the work function metal layer 240, and the gate dielectric layer 230 in the opening 162a together form a gate stack SG1, which is surrounded by the insulating layer 220. The gate stack SG1 is also referred to as a select gate stack, in accordance with some embodiments.

The gate electrode 254, the work function metal layer 240, and the gate dielectric layer 230 in the opening 164a together form a gate stack FG1, which is surrounded by the insulating layer 220. The gate stack FG1 is also referred to as a fuse gate stack, in accordance with some embodiments.

The gate electrode 256, the work function metal layer 240, and the gate dielectric layer 230 in the opening 166a together form a gate stack FG2, which is surrounded by the insulating layer 220. The gate stack FG2 is also referred to as a fuse gate stack, in accordance with some embodiments.

The gate electrode 258, the work function metal layer 240, and the gate dielectric layer 230 in the opening 168a together form a gate stack SG2, which is surrounded by the insulating layer 220. The gate stack SG2 is also referred to as a select gate stack, in accordance with some embodiments.

As shown in FIG. 1M, an etching stop layer 260 is deposited over the top surfaces of the insulating layer 220, the contact etching stop layer 210, the spacers 162, 164, 166, and 168, the gate stacks FG1 and FG2, and the gate stacks SG1 and SG2, in accordance with some embodiments. The etching stop layer 260 is made of silicon nitride, in accordance with some embodiments.

As shown in FIG. 1M, a protective layer 270 is formed over the etching stop layer 260, in accordance with some embodiments. The protective layer 270 is configured to protect, the etching stop layer 260 from damage during a subsequent pre-amorphized implantation (PAI) process, in accordance with some embodiments. The protective layer 270 includes a plasma-enhanced oxide (PEOX) layer, in accordance with some embodiments.

As shown in FIG. 1N, portions of the protective layer 270, the etching stop layer 260, the insulating layer 220, and the contact etching stop layer 210 are removed to form contact openings 282 and 284 passing through the protective layer 270, the etching stop layer 260, the insulating layer 220, and the contact etching stop layer 210, in accordance with some embodiments.

The openings 282 and 284 expose the doped structures 172a and 174a, respectively, in accordance with some embodiments. The removal process includes performing a photolithography process and an etching process, in accordance with some embodiments.

As shown in FIG. 1N, a dielectric spacer liner (DSL) layer 290 is conformally formed on the protective layer 270 and the side-walls 282a and 284a of the contact openings 282 and 284, in accordance with some embodiments. The DSL layer 290 is configured to protect the sidewalls 282 and 284a from being damaged by the subsequent PAI process. The DSL layer 290 is made of, for example, SiOC or other suitable materials.

A pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used.

The PAI process prevents subsequently doped impurities from channeling through spaces within the crystal lattice structure and reaching depths greater than desired. Portions of the doped structures 172a and 174a exposed and located at the bottoms of the openings 282 and 284 are turned into an amorphous state as a result of the PAI process.

As shown in FIG. 1N, a salication (self-aligned, silicidation) process is performed to form a metal silicide region M1 on/in the doped structure 172a and a metal silicide region M2 on/in the doped structure 174a, in accordance with some embodiments. The material of the metal silicide regions M1 and M2 includes nickel silicide, in accordance with some embodiments.

In some embodiments, the metal silicide regions 192 are made of a silicide material of a suitable metal material. The suitable metal material includes cobalt (Co), platinum (Pf), titanium (Ti), ytterbium (Yb), molybdenum (Mo), erbium (Er), or combinations thereof, in accordance with some embodiments, in some embodiments, the salication process is not performed.

As shown in FIG. 1O, a conductive layer 310 is deposited on the protective layer 270 and is filled into the openings 282 and 284 to electrically contact the metal silicide regions M1 and M2, in accordance with some embodiments. The conductive layer 330 is formed by, for example, a PVD process or other suitable processes. The conductive layer 310 is made of, for example, tungsten or other suitable conductive materials.

As shown in FIG. 1P, a planarization process is performed to remove the conductive layer 310 and the DSL layer 290 outside the openings 282 and 284, and the protective layer 270, in accordance with some embodiments. The planarization process includes a chemical mechanical polishing (CMP) process, in accordance with some embodiments.

After the CMP process, the conductive layer 310 remaining in the opening 282 forms a contact plug 312 electrically connecting the metal silicide region M1 and the doped structure 172a. The conductive layer 310 remaining in the opening 284 forms a contact plug 314 electrically connecting the metal silicide region M2 and the doped structure 174a.

After the CMP process, top surfaces of the contact plugs 312 and 314, the DSL layer 290, and the etching stop layer 260 are coplanar with each other, in accordance with some embodiments, in some embodiments, a ratio (W1/W5) of a width W1 of the isolation structure 180 to a width W5 of the gate stack FG1 ranges from about 2 to about 25.

The isolation structure 180 is in direct contact with the spacer 164 over the gate-stack FG1 and the spacer 166 over the gate stack FG2, in accordance with some embodiments. The gate stacks FG1 and FG2 are positioned at two opposite sides of the isolation structure 180, in accordance with some embodiments.

In this step, a semiconductor device structure 100 is formed. In the semiconductor device structure 100, the gate stack SG1 and the doped structure 172a and 172b together form a transistor ST1, in accordance with some embodiments. The transistor ST1 is also referred to as a select transistor, in accordance with some embodiments. The transistor ST1 and the gate stack FG1 together form a one-time programmable read only memory (OTP-ROM) cell R1, in accordance with some embodiments.

The gate stack SG2 and the doped structure 174a and 174b together form a transistor ST2, in accordance with some embodiments. The transistor ST2 is also referred to as a select transistor, in accordance with some embodiments. The transistor ST2 and the gate stack FG2 together form a one-time programmable read only memory cell R2, in accordance with some embodiments. The OTP-ROM cells R1 and R2 are electrically insulated from each other by the isolation structure 180.

When operating the OTP-ROM cell R1, a voltage $V_{dd}$ greater than the threshold turn-on voltage of the transistor ST1 is applied to the gate electrode 252 of the gate stack SG1, and a programming voltage (i.e. a high voltage) is applied to the gate electrode 254 of the gate stack FG1, in accordance with some embodiments. Therefore, a breakdown occurs in the gate dielectric layer 230 of the gate stack FG1, and a conduction path is formed from the doped structure 172a to the gate electrode 254.

In order to read data from the OTP-ROM cell R1, a voltage $V_{read}$ greater than the threshold turn-on voltage of the transistor ST1 is applied to the gate electrode 252, and the doped structure 172a is connected to ground to turn on the transistor ST1, in accordance with some embodiments.

If a breakdown occurs, then a conduction path is formed from the doped structure 172a to the gate electrode 254, thereby indicating that the OTP-ROM cell R1 is in a first state, such as "1". If a breakdown does not occur, then the conduction path cannot be formed from the doped structure 172a to the gate electrode 254, thereby indicating that the OTP-ROM cell R1 is in a second state, such as "0".

The operating method described above may also be used to operate the OTP-ROM cell R2. The isolation structure 180 may electrically insulate the OTP-ROM cell R1 from the OTP-ROM cell R2 while operating the OTP-ROM cell(s) R1 and/or R2.

Since the embodiments form the recess 116 using the gate stacks D2 and D3 as an etching mask, the recess 116 is substantially self-aligned, with the gate stacks D2 and D3 (as shown in FIG. 1E). Therefore, the isolation structure 180 formed in the recess 116 is substantially self-aligned with the gate stacks FG1 and FG2 (which replace the gate stacks D2 and D3), which prevents overlay shift of the isolation structure 180. In some other embodiments, the transistors ST1 and ST2 and the gate stacks FG1 and FG2 are used to form devices other than OTP-ROM cells.

Figure 2:
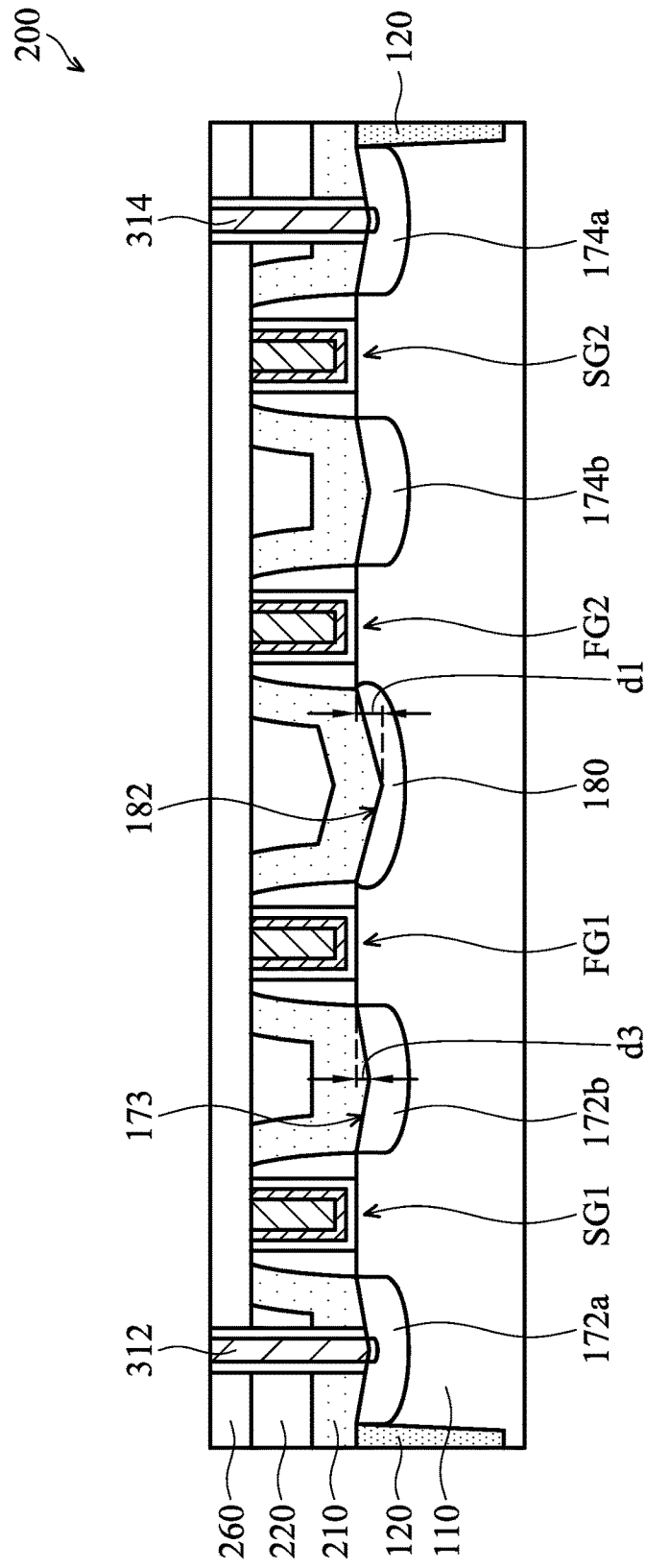
FIG. 2 is a cross-sectional view of a semiconductor device structure, in accordance with some embodiments.

FIG. 2 is a cross-sectional view of a semiconductor device structure 200, in accordance with some embodiments. The semiconductor device structure 200 is similar to the semiconductor device structure 100, except that at least one of the doped structures 172a, 1.72b, 174a, or 174b of the semiconductor device structure 200 has a recess, in accordance with some embodiments.

In some embodiments, the doped structure 172b has a recess 173. The recess 173 has a depth d3, in accordance with some embodiments. In some embodiments, a ratio of the depth d1 of the recess 182 to the depth d3 ranges from about 2 to about 10.

Figure 3A:
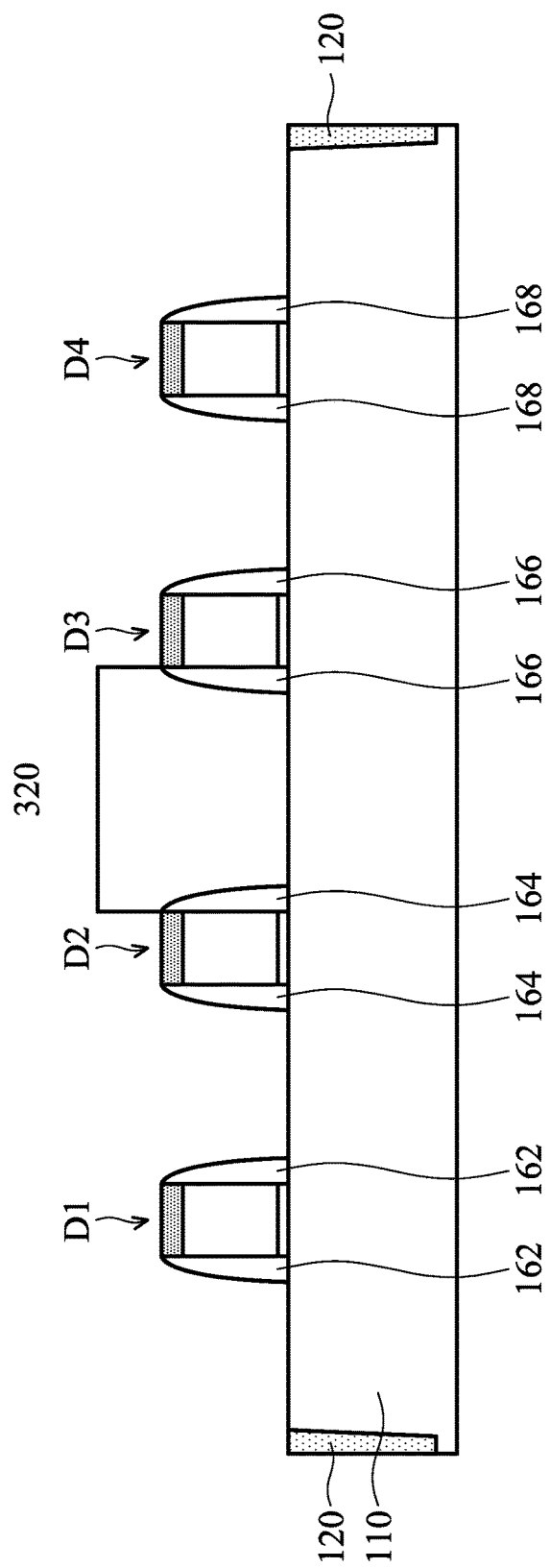
FIGS. 3A-3C are cross-sectional views of various stages of a process for forming a semiconductor device structure, in accordance with some embodiments.
Figure 3B:
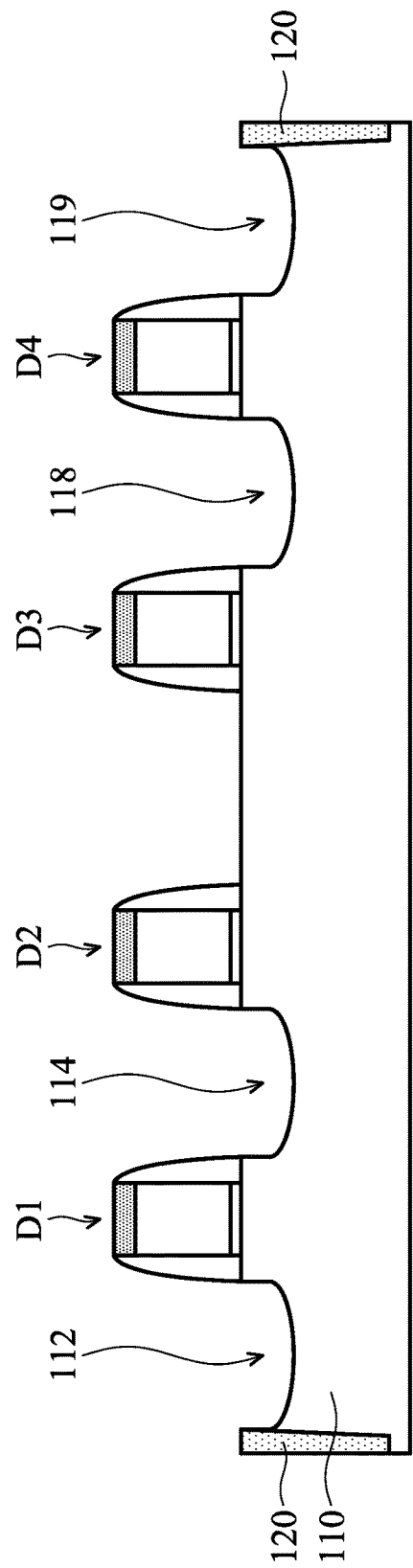
Figure 3C:
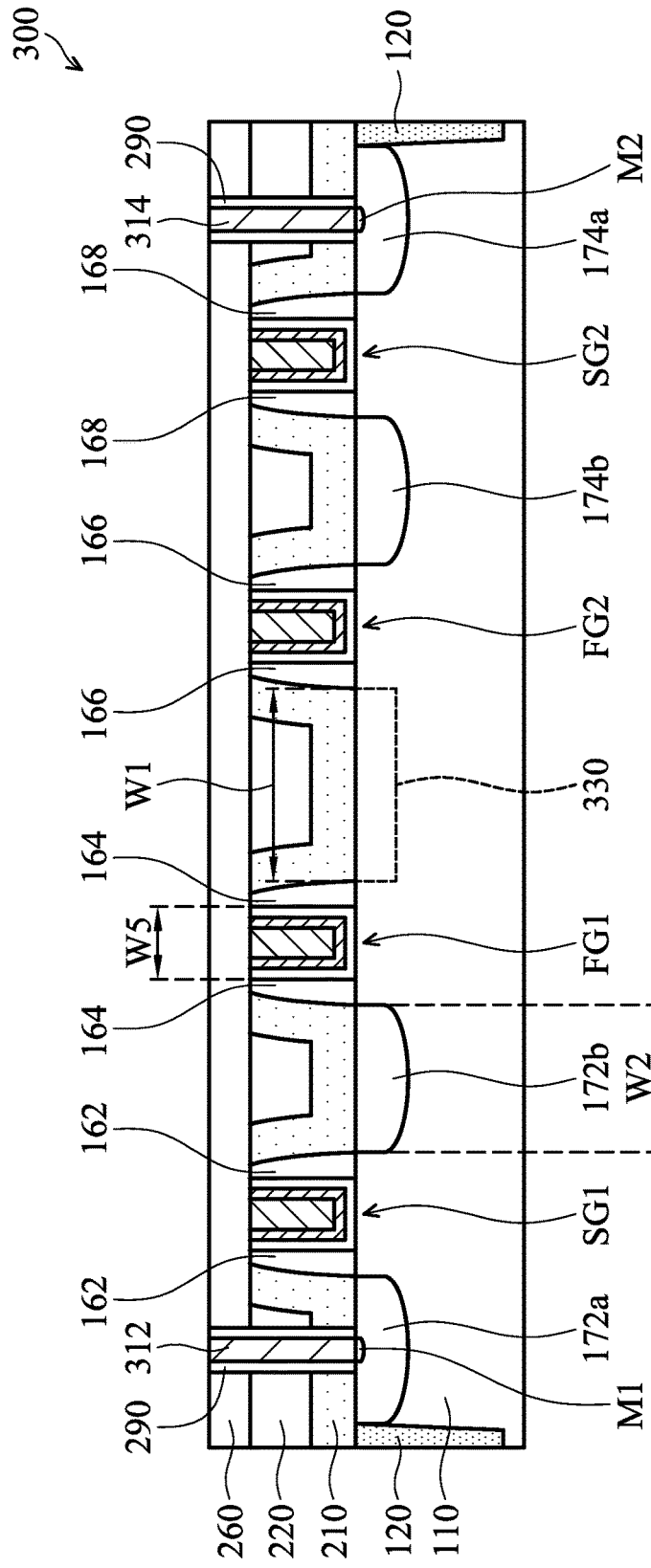

FIGS. 3A-3C are cross-sectional views of various stages of a process for forming a semiconductor device structure 300, in accordance with some embodiments. After the step of FIG. 1D, a mask layer 320 is formed between the gate stacks D2 and D3 to cover the semiconductor substrate 110 between the gate stacks D2 and D3, in accordance with some embodiments. The mask layer 320 includes, for example, a photoresist material.

As shown in FIG. 3B, portions of the semiconductor substrate 110 are removed to form recesses 112, 114, 118, and 119 in the semiconductor substrate 110, in accordance with some embodiments. Thereafter, the mask layer 320 is removed.

As shown in FIG. 3C, after the steps of FIGS. 1F-1P, the semiconductor device structure 300 is formed. The semiconductor device structure 300 is similar to the semiconductor device structure 100, except that the semiconductor device structure 300 is not formed with the recess 116 and the isolation structure 180.

If the gate stacks FG1 and FG2 are spaced apart from each other by a suitable spacing, a portion of the semiconductor substrate 110 between the gate stacks FG1 and FG2 may have enough electrical resistance to electrically insulate the gate stack FG1 from the gate stack FG2.

Therefore, the portion of the semiconductor substrate 110 may be referred as to an isolation structure 330. The isolation structure 330 may aligned with the edges of the adjacent spacers 164 and 166. The isolation structure 330 has a width W1, which is equal to a spacing between the adjacent spacers 164 and 166, in accordance with some embodiments.

In some embodiments, a ratio of the width W1 of the isolation structure 330 to the width W2 of the doped structure 172b ranges from about 1.2 to about 10. In some embodiments, the ratio of the width W1 of the isolation structure 330 to the width W2 of the doped structure 172b ranges from about 1.2 to about 3. In some embodiments, a ratio of the width W1 of the isolation structure 330 to the width W5 of the gate stack FG1 ranges from about 2 to about 25. In some embodiments, the width W1 ranges from about 50 nm to about 500 nm.

Figure 4A:
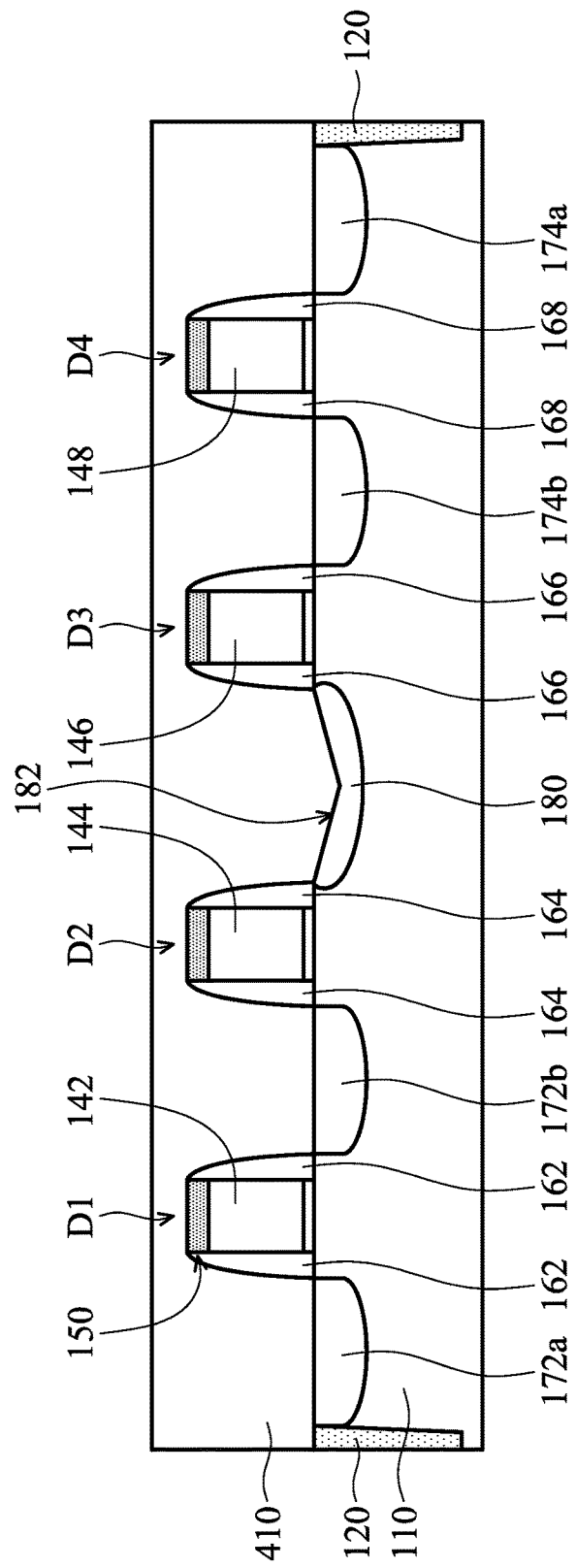
FIGS. 4A-4B are cross-sectional views of various stages of a process for forming a semiconductor device structure, in accordance with some embodiments.
Figure 4B:
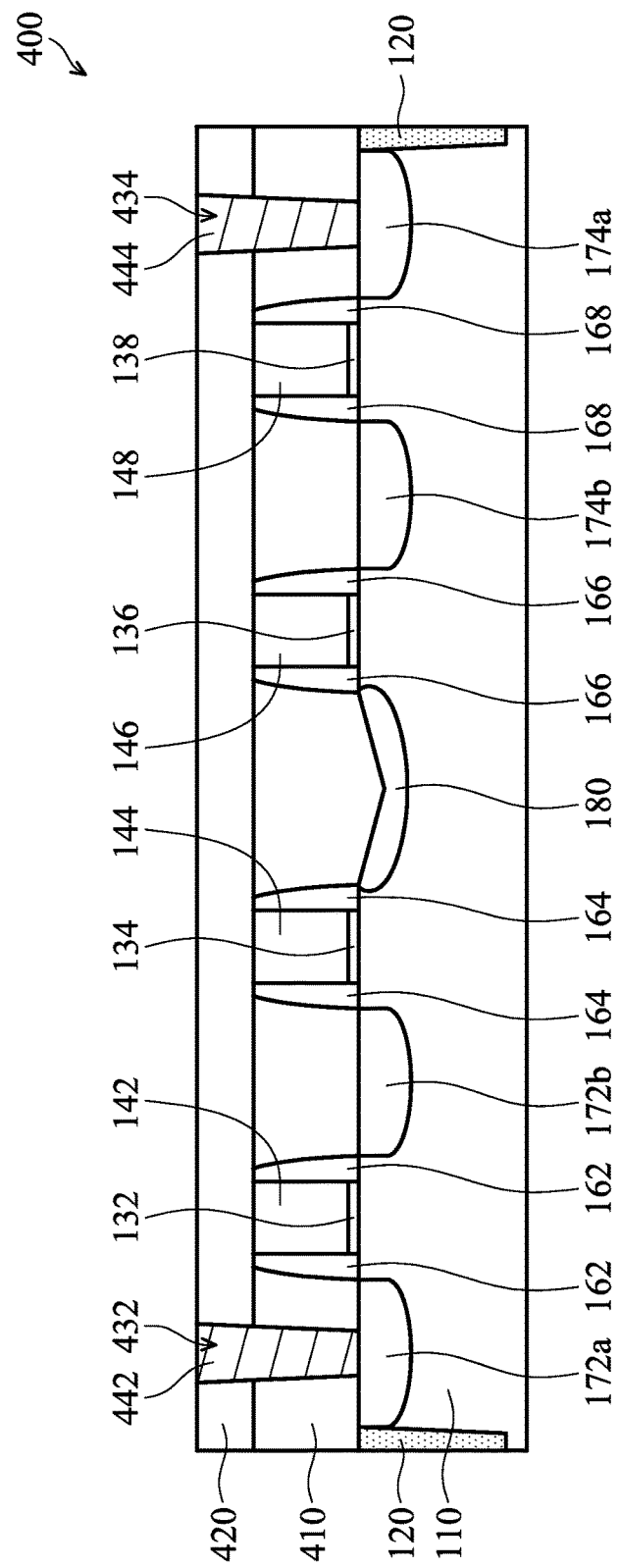

FIGS. 4A-4B are cross-sectional views of various stages of a process for forming a semiconductor device structure 400, in accordance with some embodiments. The embodiment of FIGS. 4A-4B is similar to the embodiments of FIGS. 1A-1P, except that, the embodiment of FIGS. 4A-4B forms the semiconductor device structure 400 with the poly gates 142, 144, 146, and 148.

As shown in FIG. 4A, after the step of FIG. 1F, an insulating layer 410 is formed over the semiconductor substrate 110 to cover the gate stacks D1, D2, D3, and D4, the doped structures 172a, 172b, 174a, and 174b, and the isolation structure 180, in accordance with some embodiments. The insulating layer 410 fills the recess 182, in accordance with some embodiments.

As shown in FIG. 4B, a planarization process is performed to remove the mask layer 150, portions of the insulating layer 410 and the spacers 162, 164, 166, and 168, in accordance with some embodiments. Thereafter, an insulating layer 420 is formed over the insulating layer 410, in accordance with some embodiments.

Afterwards, portions of the insulating layers 410 and 420 are removed to form contact openings 432 and 434 passing through the insulating layers 410 and 420, in accordance with some embodiments. The openings 432 and 434 expose the doped structures 172a and 174a, respectively, in accordance with some embodiments.

Thereafter, contact plugs 442 and 444 are formed in the openings 432 and 434, respectively, in accordance with some embodiments. The contact plug 442 is electrically connected to the doped structure 172a, in accordance with some embodiments. The contact plug 444 is electrically connected to the doped structure 174a, in accordance with some embodiments.

In accordance with some embodiments, semiconductor device structures and methods for forming the same are provided. The methods (for forming the semiconductor device structure) form a recess in a semiconductor substrate using gate stacks as an etching mask. Therefore, the recess is substantially self-aligned with the gate stacks, and an isolation structure subsequently formed in the recess is also substantially self-aligned with the gate stacks, which prevents overlay shift of the isolation structure. Therefore, the yield of the semiconductor device structures is improved.

In accordance with some embodiments, a semiconductor device structure is provided. The semiconductor device structure includes a semiconductor substrate. The semiconductor device structure includes a first gate stack positioned over the semiconductor substrate. The semiconductor device structure includes a first doped structure and a second doped structure positioned at two opposite sides of the first gate stack and embedded in the semiconductor substrate. The semiconductor device structure includes a second gate stack positioned over the semiconductor substrate and adjacent to the second doped structure. The semiconductor device structure includes a third gate stack positioned over the semiconductor substrate. The semiconductor device structure includes an isolation structure embedded in the semiconductor substrate and between the second gate stack and the third gate stack. The isolation structure is wider and thinner than the second doped structure, and the isolation structure is made of an epitaxial material.

In accordance with some embodiments, a semiconductor device structure is provided. The semiconductor device structure includes a semiconductor substrate. The semiconductor device structure includes a first gate stack positioned over the semiconductor substrate. The semiconductor device structure includes a first doped structure and a second doped structure positioned at two opposite sides of the first gate stack and embedded in the semiconductor substrate. The semiconductor device structure includes a second gate stack positioned over the semiconductor substrate and adjacent to the second doped structure. The semiconductor device structure includes a third gate stack positioned over the semiconductor substrate. The semiconductor device structure includes an isolation structure positioned in the semiconductor substrate. The second gate stack and the third gate stack are positioned at two opposite sides of the isolation structure. The isolation structure is made of a semiconductor material. A ratio of a first width of the isolation structure to a second width of the second doped structure ranges from about 1.2 to about 10.

In accordance with some embodiments, a method for forming a semiconductor device structure is provided. The method includes forming a first gate stack, a second gate stack, and a third gate stack, which are positioned over a semiconductor substrate and spaced apart from each other. The method includes removing portions of the semiconductor substrate to form a first recess, a second recess, and a third recess in the semiconductor substrate. The first recess is adjacent to the first gate stack. The second recess is between the first gate stack and the second gate stack. The third recess is between the second gate stack and the third gate stack. The third recess is wider than the second recess. The method includes forming a first doped structure, a second doped structure, and an isolation structure in the first recess, the second recess, and the third recess respectively. The isolation structure is wider and thinner than the second doped structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a first gate stack positioned over the semiconductor substrate;
a first doped structure and a second doped structure positioned at two opposite sides of the first gate stack respectively and embedded in the semiconductor substrate;
a second gate stack positioned over the semiconductor substrate and adjacent to the second doped structure;
a third gate stack positioned over the semiconductor substrate;
an isolation structure embedded in the semiconductor substrate and between the second gate stack and the third gate stack, wherein the isolation structure is wider and thinner than the second doped structure, a top surface of the isolation structure defines and forms a first recess thereabove, and the isolation structure is made of an epitaxial material;
a fourth gate stack positioned over the semiconductor substrate; and
a third doped structure and a fourth doped structure positioned at two opposite sides of the fourth gate stack respectively and embedded in the semiconductor substrate,
wherein the fourth doped structure is between the fourth gate stack and the third gate stack,
wherein the first gate stack, the second gate stack, the first doped structure, and the second doped structure together form a first memory cell,
wherein the third gate stack, the fourth gate stack, the third doped structure, and the fourth doped structure together form a second memory cell, and
wherein the first memory cell and the second memory cell are electrically insulated from each other by the isolation structure.

2. The semiconductor device structure as claimed in claim 1, further comprising: spacers disposed over sidewalls of the second gate stack and the third gate stack, wherein the isolation structure is in direct contact with the spacers between the second gate stack and the third gate stack, and a width of the first recess is equal to a distance between the spacers over the second gate stack and the third gate stack.

3. The semiconductor device structure as claimed in claim 1, wherein the isolation structure and the second doped structure are made of a same material.

4. The semiconductor device structure as claimed in claim 1, wherein the isolation structure has a first width, the second doped structure has a second width, and a ratio of the first width to the second width ranges from about 1.2 to about 10.

5. The semiconductor device structure as claimed in claim 1, wherein the isolation structure has a first thickness, the second doped structure has a second thickness, and a ratio of the first thickness to the second thickness ranges from about 0.3 to about 0.7.

6. The semiconductor device structure as claimed in claim 1, further comprising:
spacers disposed over sidewalls of the first gate stack, the second gate stack, and the third gate stack, wherein the isolation structure is in direct contact with the spacers over the second gate stack and the third gate stack.

7. The semiconductor device structure as claimed in claim 1, wherein the top surface of the isolation structure is not flush with a top surface of the semiconductor substrate.

8. The semiconductor device structure as claimed in claim 7, wherein the semiconductor substrate has a second recess between the second gate stack and the third gate stack, the isolation structure is disposed in the second recess, and a ratio of a first depth of the first recess to a second depth of the second recess ranges from about 0.1 to about 0.95.

9. The semiconductor device structure as claimed in claim 7, wherein the first recess has a width and a depth, and a ratio of the width to the depth ranges from about 1 to about 100.

10. The semiconductor device structure as claimed in claim 1, further comprising:
an etching stop layer covering the first doped structure and the second doped structure, and filling into the first recess that is below a top surface of the semiconductor substrate.

11. A semiconductor device structure, comprising:
a semiconductor substrate;
a first gate stack positioned over the semiconductor substrate;
a first doped structure and a second doped structure positioned at two opposite sides of the first gate stack respectively and embedded in the semiconductor substrate;
a second gate stack positioned over the semiconductor substrate and adjacent to the second doped structure;
a third gate stack positioned over the semiconductor substrate; and an isolation structure positioned in the semiconductor substrate, wherein a top surface of the isolation structure defines and forms a first recess thereabove, the second gate stack and the third gate stack are positioned at two opposite sides of the isolation structure, the isolation structure is made of a semiconductor material, and a ratio of a first width of the isolation structure to a second width of the second doped structure ranges from about 1.2 to about 10;

a fourth gate stack positioned over the semiconductor substrate; and a third doped structure and a fourth doped structure positioned at two opposite sides of the fourth gate stack respectively and embedded in the semiconductor substrate, wherein the fourth doped structure is between the fourth gate stack and the third gate stack, wherein the first gate stack, the second gate stack, the first doped structure, and the second doped structure together form a first memory cell, wherein the third gate stack, the fourth gate stack, the third doped structure, and the fourth doped structure together form a second memory cell, and wherein the first memory cell and the second memory cell are electrically insulated from each other by the isolation structure.

12. The semiconductor device structure as claimed in claim 11, wherein the semiconductor substrate and the isolation structure are made of a same material.

13. The semiconductor device structure as claimed in claim 11, further comprising:

spacers disposed over sidewalls of the second gate stack and the third gate stack, wherein the isolation structure is in direct contact with the spacers between the second gate stack and the third gate stack, and a width of the first recess is equal to a distance between the spacers over the second gate stack and the third gate stack.

14. The semiconductor device structure as claimed in claim 11, wherein a ratio of the first width of the isolation structure to a third width of the second gate stack ranges from about 2 to about 25.

15. The semiconductor device structure as claimed in claim 11, wherein each of the first and second doped structures is in direct contact with an undoped region of semiconductor substrate and does not vertically overlap with any of the first, second and third gate stacks.

16. The semiconductor device structure as claimed in claim 11, wherein the isolation structure has a first thickness, the second doped structure has a second thickness, and a ratio of the first thickness to the second thickness ranges from about 0.3 to about 0.7.

17. The semiconductor device structure as claimed in claim 11, further comprising:

spacers disposed over sidewalls of the first gate stack, the second gate stack, and the third gate stack, wherein the isolation structure is in direct contact with the spacers over the second gate stack and the third gate stack.

18. The semiconductor device structure as claimed in claim 11, wherein the top surface of the isolation structure is not flush with a top surface of the semiconductor substrate.

19. A semiconductor device structure, comprising:

a semiconductor substrate;

a first gate stack positioned over the semiconductor substrate;

a first doped structure and a second doped structure positioned at two opposite sides of the first gate stack respectively and embedded in the semiconductor substrate, wherein the first gate stack ,the first doped structure, and the second doped structure together form a first transistor;

a second gate stack positioned over the semiconductor substrate;

a third doped structure and a fourth doped structure positioned at two opposite sides of the second gate stack respectively and embedded in the semiconductor substrate, wherein the second gate stack, the third doped structure, and the fourth doped structure together form a second transistor; and an isolation structure in the semiconductor substrate and between the first transistor and the second transistor, wherein the isolation structure is wider and thinner than the second doped structure, the isolation structure is made of an epitaxial material, and the first transistor and the second transistor are electrically insulated from each other by the isolation structure.

20. The semiconductor device structure as claimed in claim 19, further comprising;

a third gate stack positioned between the second doped structure and the isolation structure; and spacers over sidewalls of the third gate stack and in direct contact with the isolation structure.

* * * * *